United States Patent
Cheng et al.

(10) Patent No.: US 12,053,851 B2
(45) Date of Patent: Aug. 6, 2024

(54) JIG AND INSTALLATION METHOD USING SAME JIG

(71) Applicant: EBARA CORPORATION, Tokyo (JP)

(72) Inventors: Lien Yin Cheng, Tokyo (JP); Akira Imamura, Tokyo (JP); Mitsuru Miyazaki, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1441 days.

(21) Appl. No.: 16/454,719

(22) Filed: Jun. 27, 2019

(65) Prior Publication Data

US 2020/0009702 A1 Jan. 9, 2020

(30) Foreign Application Priority Data

Jul. 5, 2018 (JP) .................. 2018-128355

(51) Int. Cl.
*B24B 29/02* (2006.01)
*B08B 1/32* (2024.01)
*B08B 1/50* (2024.01)
*H01L 21/67* (2006.01)

(52) U.S. Cl.
CPC ............ *B24B 29/02* (2013.01); *B08B 1/32* (2024.01); *B08B 1/50* (2024.01); *H01L 21/67046* (2013.01); *H01L 21/67051* (2013.01)

(58) Field of Classification Search
CPC .......... B08B 1/007; B08B 1/04; B24B 29/02; H01L 21/67046; H01L 21/67051; H01L 21/6838; H01L 21/68728
See application file for complete search history.

(56) References Cited

U.S. PATENT DOCUMENTS

| 5,860,181 A | 1/1999 | Maekawa et al. |
| D790,489 S | 6/2017 | Toyomura et al. |

FOREIGN PATENT DOCUMENTS

| JP | H09-92633 A | 4/1997 |
| JP | 2016-043471 A | 4/2016 |
| JP | D1549885 S | 5/2016 |

OTHER PUBLICATIONS

Patent family for U.S. Appl. No. 16/454,719.*
English translation of amendment for JP2018128355 (Year: 2022).*
English translation of grant for patent for JP2018128355 (Year: 2022).*
English translation of search report for JP2018128355 (Year: 2022).*

* cited by examiner

*Primary Examiner* — Sonya M Sengupta
(74) *Attorney, Agent, or Firm* — PEARNE & GORDON LLP

(57) ABSTRACT

A vacuum hole for suction holding a processing target object through vacuum is formed on a stage surface of a vacuum suction holding stage, and a hole corresponding to the vacuum hole is formed on an elastic pad. A jig includes a first projecting portion configured to be insertable into the vacuum hole on the vacuum suction holding stage, a support portion configured to come into contact with the stage surface with the first projecting portion inserted in the vacuum hole, and a second projecting portion projecting toward an opposite side to the first projecting portion with respect to the support portion and configured to be insertable into the hole on the elastic pad.

4 Claims, 10 Drawing Sheets

JIG AND INSTALLATION METHOD USING SAME JIG

TECHNICAL FIELD

The present invention relates to a jig and an installation method using the same jig and more particularly to a jig for use in installing an elastic pad on a stage surface of a vacuum suction holding stage and an elastic pad installation method using the same jig.

BACKGROUND ART

In recent years, substrate processing devices have been in use for performing various types of processing on substrates such as semiconductor wafers. A Chemical Mechanical Polishing (CMP) device for polishing a substrate is an example of such a substrate processing device.

The CMP device includes a polishing unit for polishing a substrate, a cleaning unit for cleaning and drying the polished substrate, and a loading/unloading unit for transferring a substrate to the polishing unit and receiving the substrate cleaned and dried by the cleaning unit. The CMP device also includes a conveyance mechanism for conveying a substrate in the polishing unit, the cleaning unit, and the loading/unloading unit. The CMP device sequentially performs these polishing, cleaning and drying processes while conveying the substrate by the conveyance mechanism. As such a cleaning unit, a cleaning unit is disclosed in which a cleaning member is brought into abutment with a semiconductor substrate to scrub the semiconductor substrate for cleaning, and after the cleaning, the surface of the cleaning member is rubbed against a flat rough surface of a maintenance member to perform a self-cleaning (refer to PTL 1).

The substrate processing device may include a buffing device from time to time. This buffing device performs at least one of a buff polishing process and a buff cleaning process on a substrate. The buff polishing process is a process in which a wafer and a buffing pad are caused to move relatively while the buffing pad is kept in contact with the wafer so as to polish a processing target surface of the wafer by interposing a slurry between the wafer and buffing pad to thereby remove unwanted matters from the polished surface of the wafer. On the other hand, the buff cleaning process is a process in which a wafer and a buffing pad are caused to move relatively while the buffing pad is kept in contact with the wafer so as to remove contaminants on the surface of the wafer by interposing a cleaning liquid (a chemical liquid or a chemical liquid and demineralized water) between the wafer and the buffing pad or modify the processing target surface of the wafer.

In the buffing device, a substrate is supported on a buffing stage through vacuum suction holding. An elastic pad is attached to the buffing stage to improve a suction holding force. This elastic pad is treated as a consumable, and a replacement elastic pad is attached periodically. In attaching an elastic pad to the buffing stage, it is general practice that a working person manually attaches an elastic pad a rear surface of which is formed as an adhesive surface to the buffing stage.

CITATION LIST

Patent Literature

PTL 1: Japanese Patent Laid-Open No. 9-92633

SUMMARY OF INVENTION

Technical Problem

Vacuum holes connected to a vacuum source are formed on the stage surface of the vacuum suction holding stage where a substrate is supported through vacuum suction holding. Holes are also formed on the elastic pad in such a manner as to correspond to the vacuum holes. Then, in attaching the elastic pad to the vacuum suction holding stage, vacuum cannot be applied to a substrate unless the vacuum holes on the vacuum suction holding stage coincide in position with the holes on the elastic pad, whereby the substrate cannot be vacuum sucked to be held properly. However, once the elastic pad is removed from the vacuum suction holding stage due to the elastic pad being offset in position from the vacuum suction holding stage, although the elastic pad is re-installed on to the vacuum suction holding stage after realignment, the adhesive force between the elastic pad and the vacuum suction holding stage is reduced. Due to this, in installing an elastic pad on to the vacuum suction holding stage, the plurality of vacuum holes and the plurality of holes on the elastic pad are required to coincide in position with each other though one installation of the elastic pad if possible. However, this aligning capability varies from a working person to a working person.

The present invention has been made in view of the problem described above, and one of objects of the present invention is to propose a jig configured to facilitate installation of an elastic pad on to a stage surface of a vacuum suction holding stage and a method for installing the elastic pad on to the vacuum suction holding stage using the same jig.

Solution to Problem

According to one aspect of the present invention, a jig is proposed which is used in installing an elastic pad on to a stage surface of a vacuum suction holding stage. Here, a vacuum hole is formed on the stage surface in such a manner as to be connectable to a vacuum source, and a hole corresponding to the vacuum hole is formed on the elastic pad. Then, the jig comprises a first projecting portion configured to be insertable into the vacuum hole on the vacuum suction holding state, a support portion configured to contact the stage surface with the first projection portion inserted in the vacuum hole, and a second projecting portion projecting toward an opposite side to the first projecting portion with respect to the support portion and configured to be insertable into the hole on the elastic pad.

According to this jig, the first projecting portion can be inserted in the vacuum hole in the vacuum suction holding stage, while the second projecting portion can be inserted in the hole on the elastic pad, whereby the vacuum suction holding stage and the elastic pad can easily be aligned with to each other properly.

According to another aspect of the present invention, a method for installing an elastic pad on to a stage surface of a vacuum suction holding stage is proposed. This method comprises a step of preparing the jig according to the one aspect of the present invention, a step of inserting the first projecting portion of the jig in a vacuum hole formed on the stage surface of the vacuum suction holding stage, and a step of inserting the second projecting portion on the jig in a hole on the elastic pad, the hole corresponding to the vacuum hole.

According to the installation method, the vacuum suction holding stage and the elastic pad can be aligned with each other, whereby the elastic pad can easily be installed on the stage surface of the vacuum suction holding stage.

DESCRIPTION OF EMBODIMENTS

Hereinafter, a jig and an installation method using the jig according to an embodiment of the present invention will be described by reference to accompanying drawings. As a matter of convenience in the following description, firstly, a buffing device including a buffing stage will be described as an example of a vacuum suction holding stage, and following this, a jig for use in installing an elastic pad on the buffing state and an installation method using the jig will be described. In the accompanying drawings, like or similar reference signs will be given to like or similar elements, so that repeated descriptions of the like or similar elements over embodiments may be omitted from time to time. Characteristics described in one embodiment can also be applied to other embodiments, provided that those characteristics do not contradict to one another over the embodiments.

Figure 1:
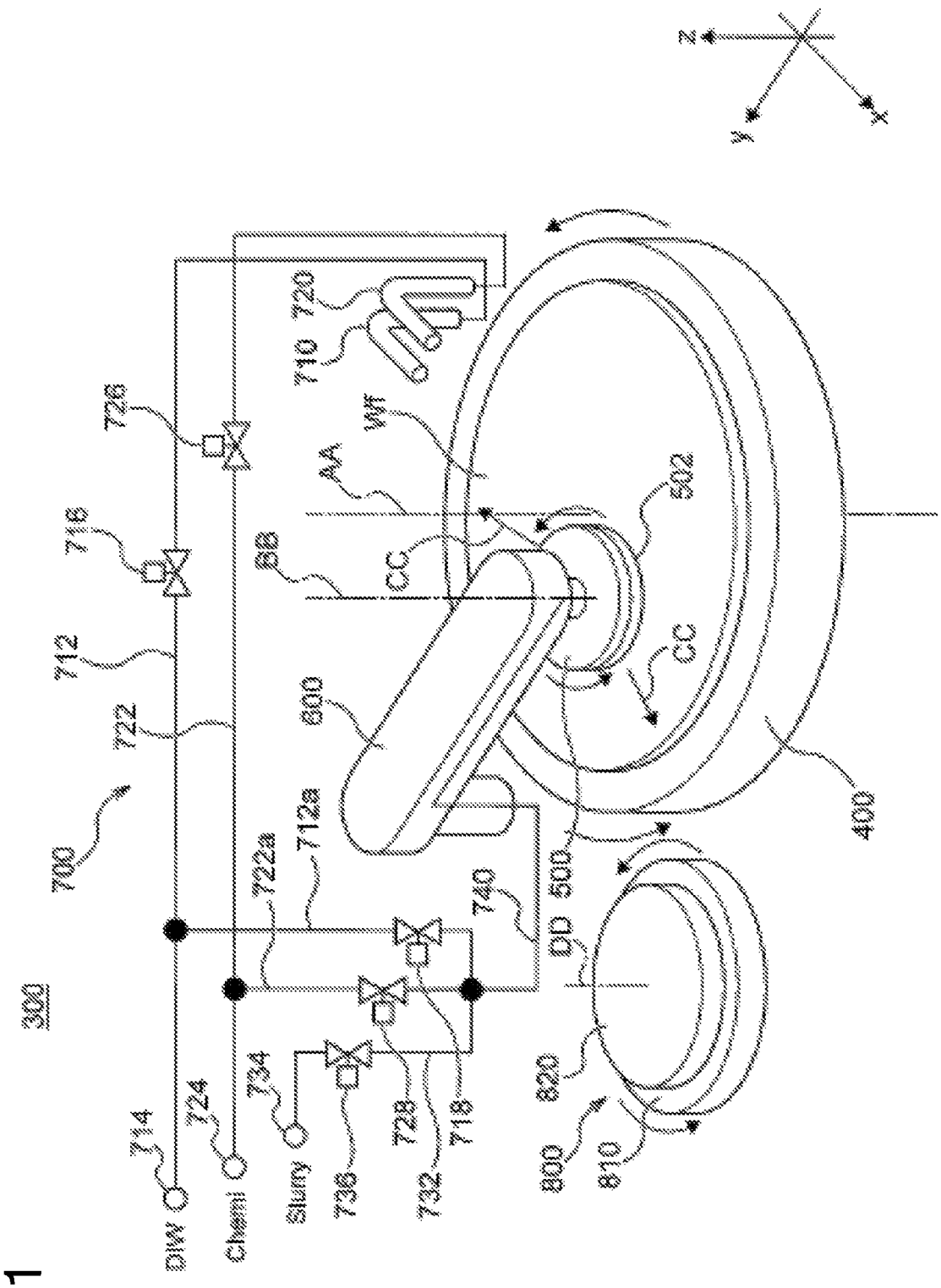
FIG. 1 is a drawing illustrating a schematic configuration of a buffing device according to one embodiment.

FIG. 1 is a drawing illustrating a schematic configuration of a buffing device according to one embodiment. A buffing device illustrated in FIG. 1 can make up part of a CMP device configured to polish a substrate (a processing target object) such as a semiconductor wafer or one unit of the CMP device. As an example, the buffing device can be incorporated in a CMP device including a polishing unit, a cleaning unit, and a substrate conveyance mechanism, for example, a CMP device disclosed in Japanese Patent Laid-Open No. 2010-504365. The buffing device can be used for a finishing process carried out after a main polishing process is carried out within the CMP device.

In this specification, a buffing process or buffing includes at least one of a buff polishing process and a buff cleaning process.

The buff polishing process means a process in which a substrate and a buffing pad are caused to move relatively while the buffing pad is kept in contact with the substrate so as to polish a processing target surface of the substrate by interposing a slurry between the substrate and buffing pad to thereby remove unwanted matters from the polished surface of the substrate. The buff polishing process is the process that can apply to the substrate a stronger physical acting force than a physical acting force applied to the substrate when the substrate is cleaned through a physical action using a sponge material (for example, a PVA sponge material) or the like. Due to this, as the buffing pad, materials can be used which include a pad in which a foamed polyurethane and a nonwoven fabric are laminated on each other, specifically, an IC1000 (trademark)/SUBA (registered trademark) system that is available in a marketplace, or a suede-like porous polyurethane non-fibrous pad, specifically, a POLITEX (registered trademark) that is available in a marketplace. The buff polishing process can realize a removal of a surface layer portion where damage such as a scratch or contaminants exist, an additional removal of a portion that cannot be removed during the main polishing by a main polishing unit, or an improvement in morphology such as irregularities in a minute zone or a film thickness distribution over the whole of a substrate after the main polishing.

The buff cleaning process is a process in which a substrate and a buffing pad are caused to move relatively while the buffing pad is kept in contact with the substrate so as to remove contaminants on a surface of the substrate by interposing a cleaning liquid (a chemical liquid, or a chemical liquid and demineralized water) between the substrate and the buffing pad or modify the processing target surface of the substrate. The buff cleaning process is the process that can apply to the substrate a stronger physical acting force than a physical acting force applied to the substrate when the substrate is cleaned through a physical action using a sponge material or the like. Due to this, as the buffing pad, the IC1000 (trademark)/SUBA (registered trademark) system, or the POLITEX (registered trademark) can be used. Further, in the buffing device according to the present invention, the PVA sponge can also be used as the buffing pad.

FIG. 1 is the drawing schematically illustrating the configuration of a buffing device 300 to which a wafer Wf (a substrate) is attached. The buffing device 300 can perform the buff polishing process and/or the buff cleaning process. As illustrated in FIG. 1, the buffing device 300 according to the embodiment of the present invention includes a buffing stage (a vacuum suction holding stage) 400, a buff head 500, a buff arm 600, a liquid supply system 700, and a conditioning unit 800.

The buffing stage (the vacuum suction holding stage) 400 is provided to support the wafer Wf through vacuum suction holding. The buffing stage 400 is allowed to rotate around a rotating axis AA by a drive mechanism, not shown. In this embodiment, the buffing stage 400 supports the wafer Wf horizontally thereon in such a manner that a processing target surface of the wafer Wf is directed upwards. Although it will be described in detail later, an elastic pad 450 is attached to a stage surface 402 of the buffing stage 400, and the buffing stage 400 supports the wafer Wf via the elastic pad 450. For the sake of a simple description, a support surface 452 of the elastic pad 450, which supports the wafer Wf, will also be referred to as a "support surface" of the buffing stage 400.

The buff head 500 is provided to buff the wafer Wf installed on the buffing stage 400. The buff head 500 can be raised from and lowered towards the buffing stage 400. A buffing pad 502 is attached to a surface of the buff head 500 that faces the wafer Wf. The buffing pad 502 is pressed against the wafer Wf held to the stage surface 402 of the buffing stage 400 as a result of the buff head 500 being lowered.

In the illustrated embodiment, the buffing pad 502 is smaller in diameter than the buffing stage 400 and the wafer Wf that is to be buffed. By buffing the wafer Wf using the buffing pad smaller in size than the wafer Wf that is to be buffed thereby, irregularities generated locally on the wafer Wf can easily be flattened, only a specific portion of the wafer Wf can easily be buff polished, or the polishing amount can easily be controlled according to positions on the wafer Wf. However, the buff head 500 is not limited to these applications, and a cleaning brush or a sponge material may be used for the buff head 500.

Figure 2:
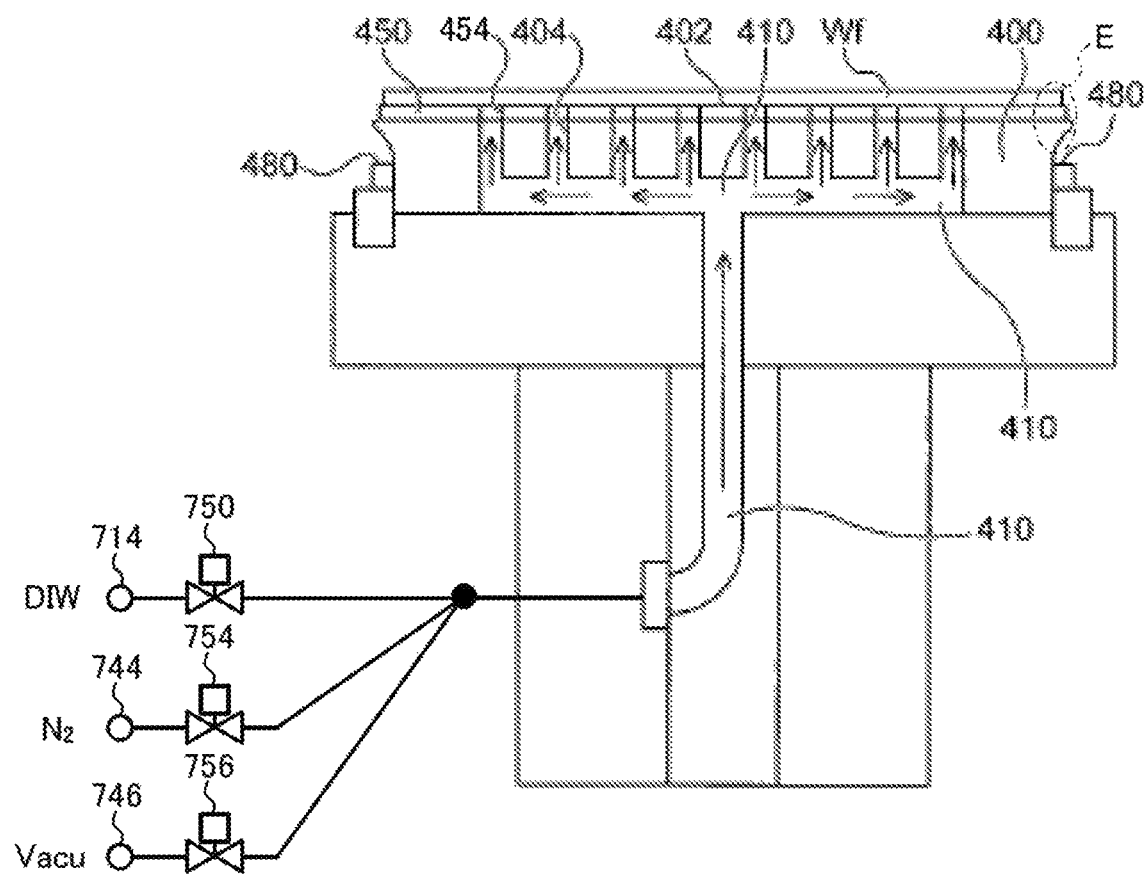
FIG. 2 is a drawing illustrating an example of a schematic cross-sectional view of the buffing device.

The buff arm 600 holds the buff head 500. The buff arm 600 can not only rotate the buff head 500 around a rotating axis BB but also swing the buff head 500 in a radial direction of the wafer Wf as indicated by an arrow CC. The buff arm 600 can move the buff head 500 to a position where the buffing pad 502 faces the conditioning unit 800 vertically, as illustrated in FIG. 2.

The liquid supply system 700 is provided to supply various types of processing liquid to the processing target surface of the wafer Wf or the buffing stage 400 (the elastic pad 450). In this embodiment, the liquid supply system 700 includes a demineralized water nozzle 710 for supplying demineralized water (DIW), a chemical liquid nozzle 720 for supplying a chemical liquid (Chemi). The demineralized water nozzle 710 is connected to a demineralized water supply source 714 by way of a demineralized water piping 712. An opening/closing valve 716 is provided on the demineralized water piping 712 to open and close the demineralized water piping 712. The chemical liquid nozzle 720 is connected to a chemical liquid supply source 724 by way of a chemical liquid piping 722. An opening/closing valve 726 is provided on the chemical liquid piping 722 to open and close the chemical liquid piping 722.

In the buffing device 300 according to the embodiment shown in FIG. 1, demineralized water, a chemical liquid, or a slurry can selectively be supplied to the processing target surface of the wafer Wf or the support surface of the buffing stage 400 by way of the buff arm 600, the buff head 500, and the buffing pad 502.

That is, a branch demineralized water piping 712a branches off from the demineralized water piping 712 at a portion between the demineralized water supply source 714 and the opening/closing valve 716. A branch chemical liquid piping 722a branches off from the chemical liquid piping 722 at a portion between the chemical liquid supply source 724 and the opening/closing valve 726. The branch demineralized water piping 712a, the branch chemical liquid piping 722a, and a slurry piping 732 connected to a slurry supply source 734 merge into a liquid supply piping 740. An opening/closing valve 718 is provided on the branch demineralized water piping 712a to open and close the branch demineralized water piping 712a. An opening/closing valve 728 is provided on the branch chemical liquid piping 722a to open and close the branch chemical liquid piping 722a. An opening/closing valve 736 is provided on the slurry piping 732 to open and close the slurry piping 732.

A first end portion of the liquid supply piping 740 is connected to the piping of the three systems of the branch demineralized water piping 712a, the branch chemical liquid piping 722a, and the slurry piping 732. The liquid supply piping 740 extends through an interior of the buff arm 600, a center of the buff head 500, and a center of the buffing pad 502. A second end portion of the liquid supply piping 740 is opened to the processing target surface of the wafer Wf or the support surface of the buffing stage 400 where the wafer Wf is supported. A control unit, not shown, can supply any one of demineralized water, the chemical liquid and the slurry, or a mixture liquid of an arbitrary combination thereof to the processing target surface of the wafer Wf or the support surface of the buffing stage 400 where the wafer Wf is supported at an arbitrary timing by controlling the opening and closing of the opening/closing valve 718, the opening/closing valve 728, and the opening/closing valve 736.

In the buffing device 300 according to the illustrated embodiment, the buffing stage 400 is rotated around a rotating axis AA while a processing liquid is supplied to the wafer Wf by way of the liquid supply piping 740, and the buffing pad 502 is pressed against the processing target surface of the wafer Wf. Then, the buffing pad 502 is swung in the direction indicated by the arrow CC while the buffing pad 502 is being rotated around a rotating axis BB, whereby the wafer Wf can be buffed.

In the buffing device 300 configured in the way described above, with the wafer Wf kept supported on the buffing stage 400, the processing liquid is supplied to the wafer Wf by the liquid supply system 700, and the buffing stage 400 is rotated around the rotating axis AA. Also, in the buffing device 300, the buffing pad 502 is pressed against the processing target surface of the wafer Wf, and the buffing pad 502 is swung in the direction indicated by the arrow CC while being rotated around the rotating axis BB, whereby the wafer Wf can be buffed.

The conditioning unit 800 is provided to condition a surface of the buffing pad 502. The conditioning unit 800 includes a dressing table 810 and a dresser 820 installed on the dressing table 810. The dressing table 810 is allowed to rotate around a rotating axis DD by a drive mechanism, not shown. The dresser 820 is made up of a diamond dresser, a brush dresser, or a combination thereof.

In the buffing device 300, in conditioning the buffing pad 502, the buff arm 600 is swung to such an extent that the buffing pad 502 comes to face the dresser 820 (refer to FIG. 2). In the buffing device 300, the dressing table 810 is rotated around the rotating axis DD, while the buff head 500 is rotated, and the buffing pad 502 is pressed against the dresser 820, whereby the buffing pad 502 is conditioned.

The buffing stage 400 may be cleaned with no wafer Wf existing on the buffing stage 400. When cleaning the buffing stage 400, a chemical liquid is sprayed against the support surface 452 from the chemical liquid nozzle 720 to thereby clean the support surface 452. Abrasive grains or abrasion products that adhere to the support surface 452 can effectively be cleaned off by the use of the chemical liquid. Thereafter, demineralized water is supplied to the support surface 452 from the demineralized water nozzle 710 to further clean the support surface 452.

Figure 3:
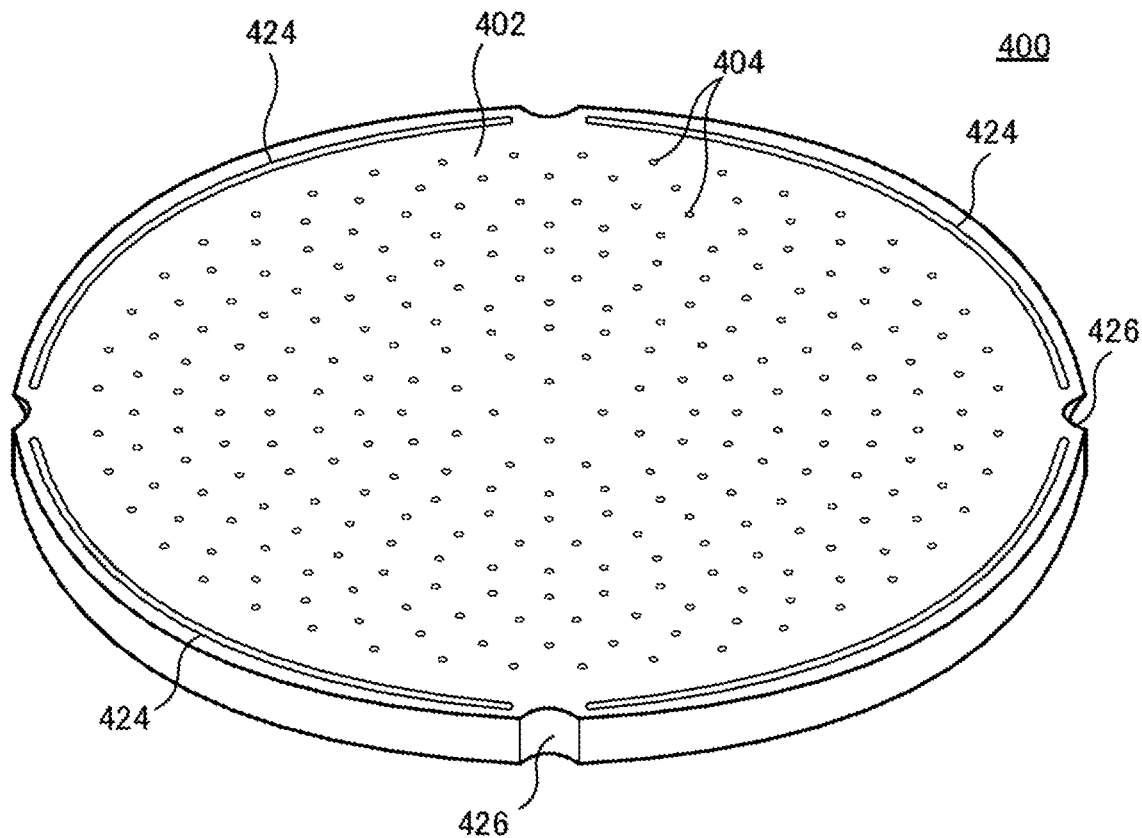
FIG. 3 is a perspective view illustrating a buffing stage in an enlarged fashion.

Following this, the buffing stage 400, which is provided to hold the wafer Wf through vacuum suction, will be described in greater detail. FIG. 2 is a drawing illustrating an example of a schematic cross-sectional view of the buffing device, and FIG. 3 is a perspective view illustrating the buffing stage in an enlarged fashion. As shown in FIGS. 2 and 3, a plurality of first openings (vacuum holes) 404 are formed on the stage surface 402 of the buffing stage 400 to hold the wafer Wf to the stage surface 402 through vacuum suction. The buffing stage 400 includes a first fluid passageway 410 that extends to the first openings 404 in an interior of the buffing stage 400. The first fluid passageway 410 is connected to a vacuum source 746. Further, the first fluid passageway 410 is also connected to the demineralized water supply source 714 and a hydrogen source 744 that can both be used in detaching the wafer Wf from the stage surface 402. The first fluid passageway 410 may also include an atmosphere opening valve (not shown) to open an interior of the first fluid passageway 410 to the atmosphere. For example, when detaching the wafer Wf, vacuum in the first fluid passageway 410 is released to thereby supply demineralized water into the first fluid passageway 410 by a predetermined period of time, and thereafter, hydrogen can be supplied thereinto by a predetermined period of time. Opening/closing valves 750, 754, 756 are provided on pipings through which demineralized water and hydrogen gas are supplied to the first fluid passageway 410 of the buffing stage 400 and a piping through which a vacuum is drawn in the first fluid passageway 410, respectively. By controlling the opening and closing the opening/closing valves 750, 754, 756 using the control unit, not shown, demineralized water and hydrogen gas can be supplied to the support surface through the first fluid passageway 410 of the buffing stage 400 at arbitrary timings, and a vacuum can be drawn in the first fluid passageway 410 at an arbitrary timing.

In addition, as illustrated in FIG. 2, the buffing stage 400 includes a lift pin 480 configured not only to receive a wafer Wf that is conveyed by a conveyance robot, not shown, as a conveyance mechanism but also to allow the wafer Wf so received to rest thereon. A plurality of (for example, four) lift pins 480 are disposed along an outer circumference of the buffing stage 400, and the lift pins 480 are made to extend and retract by a mechanism, not shown. When the lift pins 480 project, the lift pins 480 receive the wafer Wf while supporting the wafer Wf at an outer circumferential portion thereof, and thereafter, the lift pins 480 retract to thereby allow the wafer Wf to rest on the support surface of the buffing stage 400. After a buffing process is finished, the lift pins 480 protrude to raise the wafer Wf while supporting the wafer Wf at the outer circumferential portion thereof, and the conveyance robot scoops up the wafer Wf from below.

As illustrated in FIG. 3, recess portions 426 are formed on a circumferential edge portion of the buffing stage 400. The recess portions 426 are provided in such a manner as to correspond to the lift pins 480, and the lift pins 480 extend and retract along the corresponding recess portions 426. Additionally, grooves 424 are formed on the circumferential edge portion of the buffing stage 400 in such a manner as to extend along a circumferential edge of the stage surface 402. In other words, the grooves 424 surround at least partially an area where the first openings 404 are formed. In this embodiment, the grooves 424 are formed along the circumferential edge of the stage surface 402 excluding portions lying near the recess portions 426.

Figure 4:
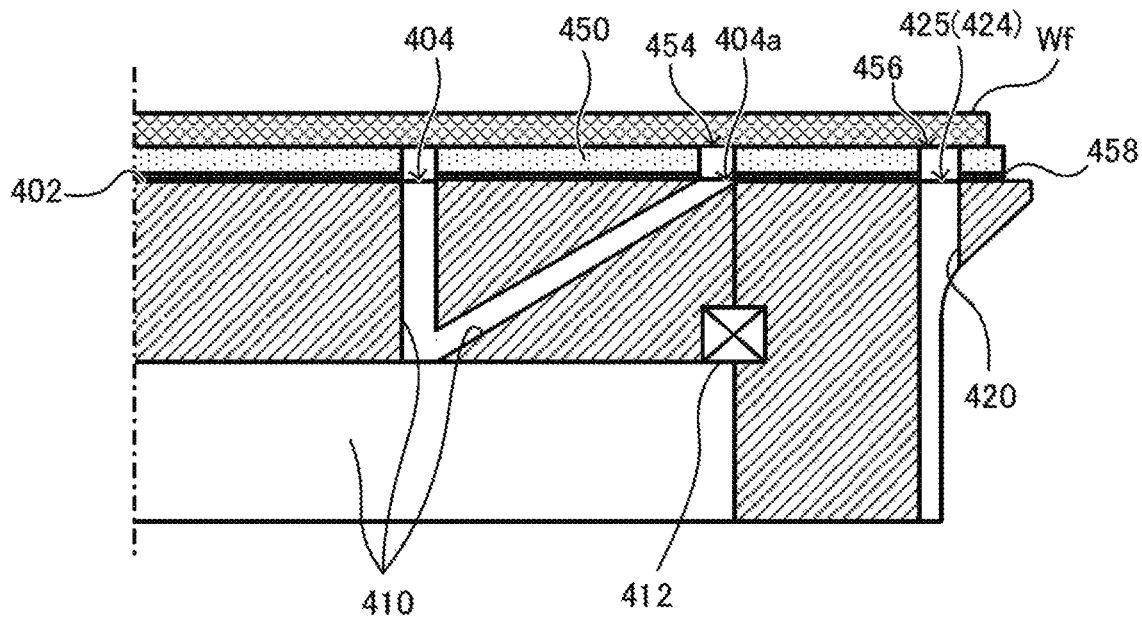
FIG. 4 is a drawing illustrating a zone surrounded by an alternate long and short dash line in FIG. 2 in an enlarged fashion.

FIG. 4 is a drawing illustrating a zone surrounded by an alternate long and short dash line in FIG. 2 in an enlarged fashion. As has been described above, in this embodiment, the first fluid passageway 410 is connected to the plurality of first openings 404 on the buffing stage 400. The first fluid passageway 410 basically extends at right angles to the stage surface 402 to be connected to the first openings 404 (refer to FIG. 2). On the other hand, in this embodiment, as illustrated in FIG. 4, fasteners 412 are positioned below the first openings 404 (404a) of the plurality of first openings 404 that are positioned at a radially outermost circumferential side of the stage surface 402. Due to this, the first fluid passageway 410 that is connected to the first openings 404a that are positioned at the radially outermost circumferential side of the stage surface 402 is inclined relative to the stage surface 402 (omitted in FIG. 2). Additionally, as illustrated in FIG. 4, second openings 425 (omitted in FIGS. 2, 3) are formed near an outer circumference of the buffing stage 400. The second openings 425 are formed in the grooves 424 and are opened to an outside of the buffing stage 400 by way of a second fluid passageway 420. That is, the grooves 424 each connect the plurality of second openings 425 on the stage surface 402. Thus, the processing liquid can be restrained from being absorbed between the wafer Wf and the support surface of the buffing stage 400 by the grooves 424 and the second openings 425.

In particular, as illustrated in FIG. 3, the elastic pad 450 is attached to the stage surface 402 of the buffing stage 400, whereby the buffing stage 400 supports the wafer Wf via the elastic pad 450. The elastic pad 450 that is attached to the buffing stage 400 can be formed, for example, of elastic foamed polyurethane. The elastic pad 450 functions as a damper material between the buffing stage 400 and the wafer Wf and can not only prevent the wafer Wf being damaged but also mitigate the influence of irregularities on the surface of the buffing stage 400 on a buffing process. The elastic pad 450 is attached to the stage surface 402 of the buffing stage 400 with an adhesive layer 458 (refer to FIGS. 4, 6) that is provided on one surface thereof. An elastic pad having holes (through holes) 454 provided in positions thereon that correspond to the first openings 404 on the buffing stage 400 can be used for the elastic pad 450 (refer to FIG. 3).

Figure 5:
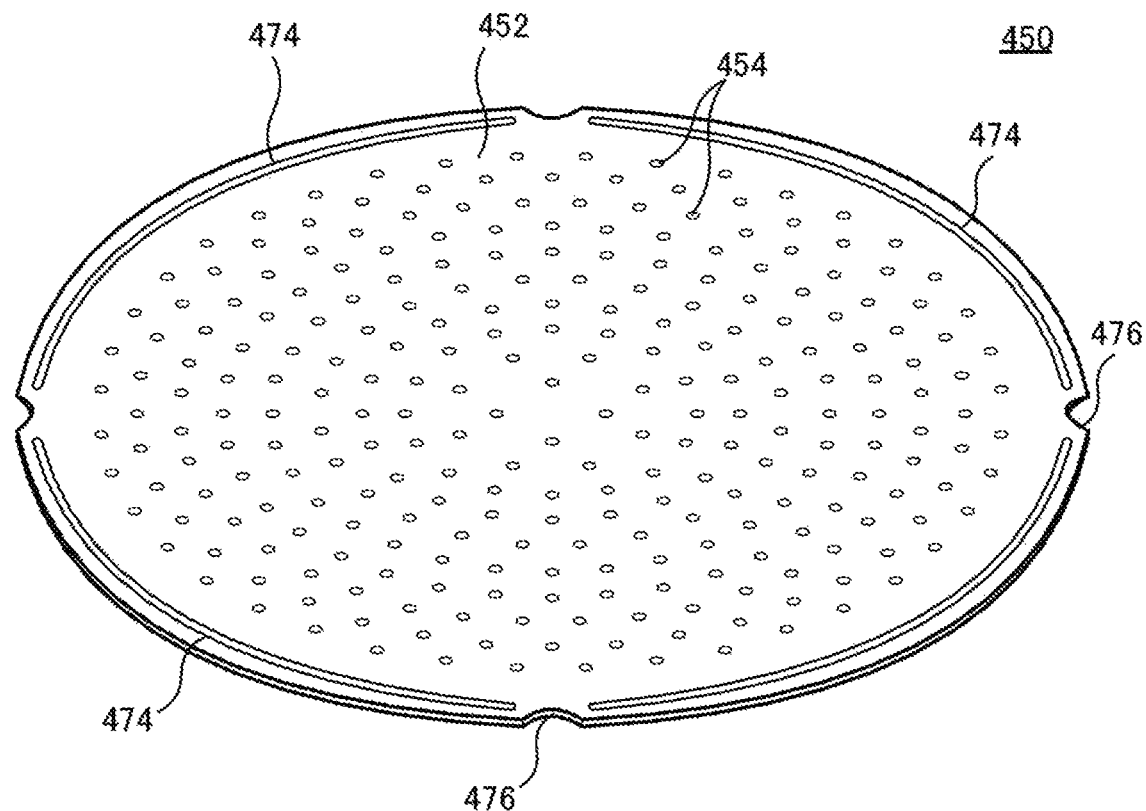
FIG. 5 is a drawing illustrating an example of an elastic pad.

FIG. 5 is a drawing illustrating an example of an elastic pad. The elastic pad 450 includes a plurality of holes 454 that correspond to the plurality of first openings 404 formed on the stage surface 402 of the buffing stage 400. The elastic pad 450 includes notches 476 formed in such a manner as to correspond to the recess portions 426 formed on the buffing stage 400 and grooves 474 formed in such a manner as to correspond to the grooves 424 formed on the buffing stage 400. Here, the plurality of holes 454, the notches 476 and the grooves 474 that are formed on the elastic pad 450 are desirably sized slightly larger than the plurality of first openings 404, the recess portions 426 and the grooves 424 that are formed on the buffing stage 400, respectively. As a result of adopting this configuration, the elastic pad 450 can be aligned with the buffing stage 400 with a certain magnitude of margin. This can prevent the openings formed on the buffing stage 400 from being closed by the elastic pad 450 when the elastic pad 450 is attached to the buffing stage 400.

Figure 6:
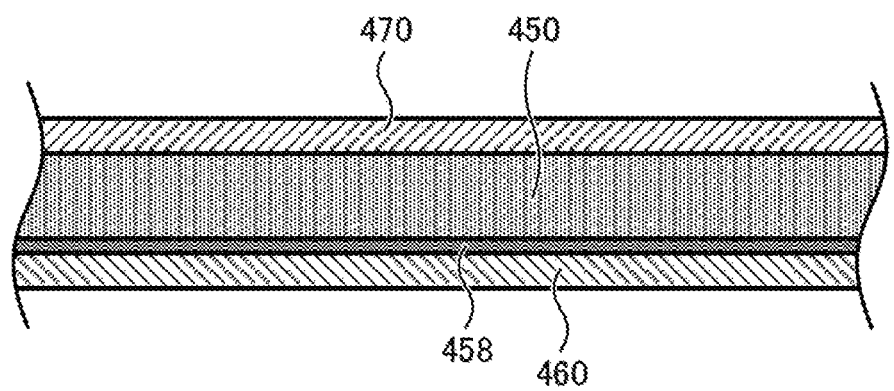
FIG. 6 is a cross-sectional view illustrating an example of an elastic pad before it is attached to the buffing stage.

FIG. 6 is a cross-sectional view illustrating an example of an elastic pad before the elastic pad is attached to the buffing stage. In this embodiment, the adhesive layer 458 is provided on the one surface of the elastic pad 450, and a separation film 460 is attached to the one surface of the elastic pad 450 to facilitate the carriage of the elastic pad 450. The separation film 460 can be peeled off from the adhesive layer 458, and the separation film 460 is peeled off from the elastic pad 450 when the elastic pad 450 is installed on the buffing stage 400. A protection sheet 470 formed of a material having a lower extensibility than that of the elastic pad 450 (for example, PET or the like) is attached to a surface of the elastic pad 450 which is opposite to the surface where the adhesive layer 458 is provided. The protection sheet 470 protects the elastic pad 450 when the elastic pad 450 is carried and installed and is peeled off from the elastic pad 450 after the elastic pad 450 is installed on the buffing stage 400. In this embodiment, openings are formed on the separation film 460 and the protection sheet 470 in the same way as the way in which the openings (the holes 454, the notches 476, and the grooves 474) are formed on the elastic pad 450 (not shown). In installing the elastic pad 450 on the buffing stage 400, as will be described later, the elastic pad 450 can be restrained from stretching or contracting by the protection sheet 470, and this facilitates an alignment of the elastic pad 450 with the buffing stage 400. However, the present invention is not limited to this configuration, and hence, such openings may not be formed on at least one of the separation film 460 and the protection sheet 470. In addition, the protection sheet 470 may not be attached to the elastic pad 450.

Figure 7:
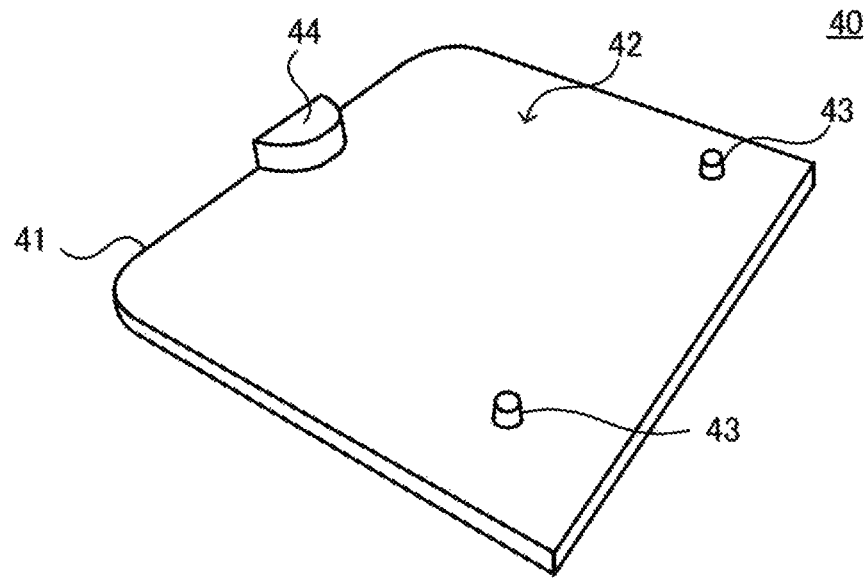
FIG. 7 is a perspective view illustrating an example of a lower surface of a jig according the embodiment.
Figure 8:
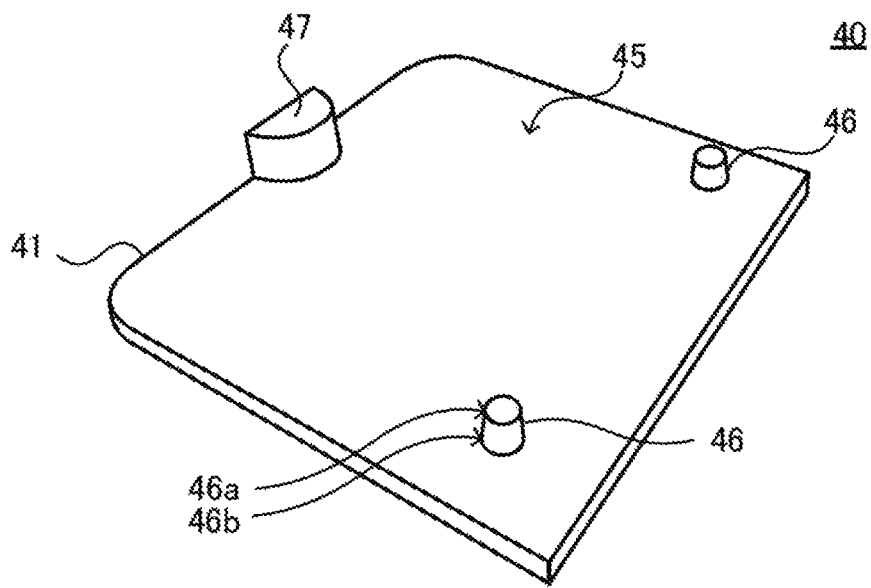
FIG. 8 is a perspective view illustrating an example of an upper surface of the jig according to the embodiment.

Next, a jig will be described which is used to install the elastic pad 450 on the buffing stage 400. FIG. 7 is a perspective view illustrating an example of a lower surface of a jig according to the embodiment, and FIG. 8 is a perspective view illustrating an example of an upper surface of the jig according to this embodiment. As shown in the figures, the jig 40 of this embodiment has such a configuration that the jig 40 includes a plate-like portion 41 having a lower surface 42 (refer to FIG. 7) and an upper surface 45 (refer to FIG. 8) and that a plurality of projecting portions are provided on the plate-like portion 41. The jig 40 configured as described above can be formed from synthetic resin such as polyvinyl chloride (PVC) through injection molding. However, the present invention is not limited to this example, and hence, the jig 40 may be formed from metal such as aluminum.

The lower surface 42 of the jig 40 has at least one first projecting portion 43 (two in the example illustrated in FIG. 7) and a third projecting portion 44. The first projecting portion 43 is sized so as to be slightly smaller than a diameter of the plurality of first openings 404 on the buffing stage 400. In the case where there are provided a plurality of first projecting portions 43, the plurality of first projecting portions 43 are provided so that their positions correspond to those of some of the plurality of first openings 404. That is, the first projecting portion 43 of the jig 40 can be inserted into the first opening 404 on the buffing stage 400. In addition, the third projecting portion 44 is configured to correspond to the recess portion 426 formed on the circumferential edge portion of the buffing stage 400. Then, the third projecting portion 44 is aligned with the recess portion 426 on the buffing stage 400, and the first projecting portions 43 are inserted into the corresponding first openings 404 on the buffing stage 400, whereby the lower surface 42 of the jig 40 comes into contact with the stage surface 402 of the buffing stage 400, and the jig 40 is installed on the buffing stage 400. Here, in this embodiment, the lower surface 42 that comes into contact with the stage surface 402 with the first projecting portions 43 inserted into the corresponding first openings 404 constitutes a "support portion".

In this embodiment, the first projecting portions 43 are provided so as to correspond to the first openings 404 (404b) that lie on a second radially outermost circumferential row from an outer circumferential side of the buffing stage 400 with the third projecting portion 44 aligned with the recess portion 426 on the buffing stage 400. Thus, as described above, in this embodiment, the first fluid passageway 410 is inclined at the first openings 404a on the first radially outermost circumferential row on the buffing stage 400 (refer to FIG. 4), and hence, it becomes difficult to fit the jig 40 in the first openings 404a on the first radially outermost circumferential row on the buffing stage 400. Due to this, in this embodiment, the first openings 404b on the second radially outermost circumferential row from the outer circumferential side are made use of for fitment of the jig 40. However, the present invention is not limited to this example, and hence, the first projecting portions 43 of the jig 40 may be provided so as to correspond to the first openings 404 on the first radially outermost circumferential row of the buffing stage 400.

The upper surface 45 of the jig 40 has at least one second projecting portion 46 (two in the example illustrated in FIG. 8) and a fourth projecting portion 47. The second projecting portions 46 projects toward an opposite side to the side to which the first projecting portions 43 project and are preferably provided in positions corresponding to those of the first projecting portions 43 on the plate-like portion 41. However, the present invention is not limited to this example, and hence, the second projecting portions 46 may be provided in a different number from the number of first projecting portions 43 and may be provided in different positions that do not correspond to the positions of the first projecting portions 43. In the second projecting portion 46, a distal end portion 46a is sized so as to be smaller than the holes 454 on the elastic pad 450, and the second projecting portion 46 is tapered in such a manner as to increase in diameter as it extends farther from the distal end portion 46a. In this embodiment, in the second projecting portion 46, a proximal portion 46b is sized so as to be larger than the holes 454 on the elastic pad 450. Further, in the case where there are provided a plurality of second projecting portions 46, the second projecting portions 46 are provided so that their positions correspond to those of the plurality of holes 454 on the elastic pad 450. At least some of these second projecting portions 46 of the jig 40 that are configured in the way described above can be inserted into the holes 454 on the elastic pad 450. The fourth projecting portion 47 is configured so as to correspond to a notch 476 formed on a circumferential edge portion of the elastic pad 450. Then, the fourth projecting portion 47 is aligned with the notch 476 on the elastic pad 450, and the second projecting portions 46 are inserted in the holes 454 on the elastic pad 450, whereby the jig 40 is attached to the elastic pad 450.

Figure 9:
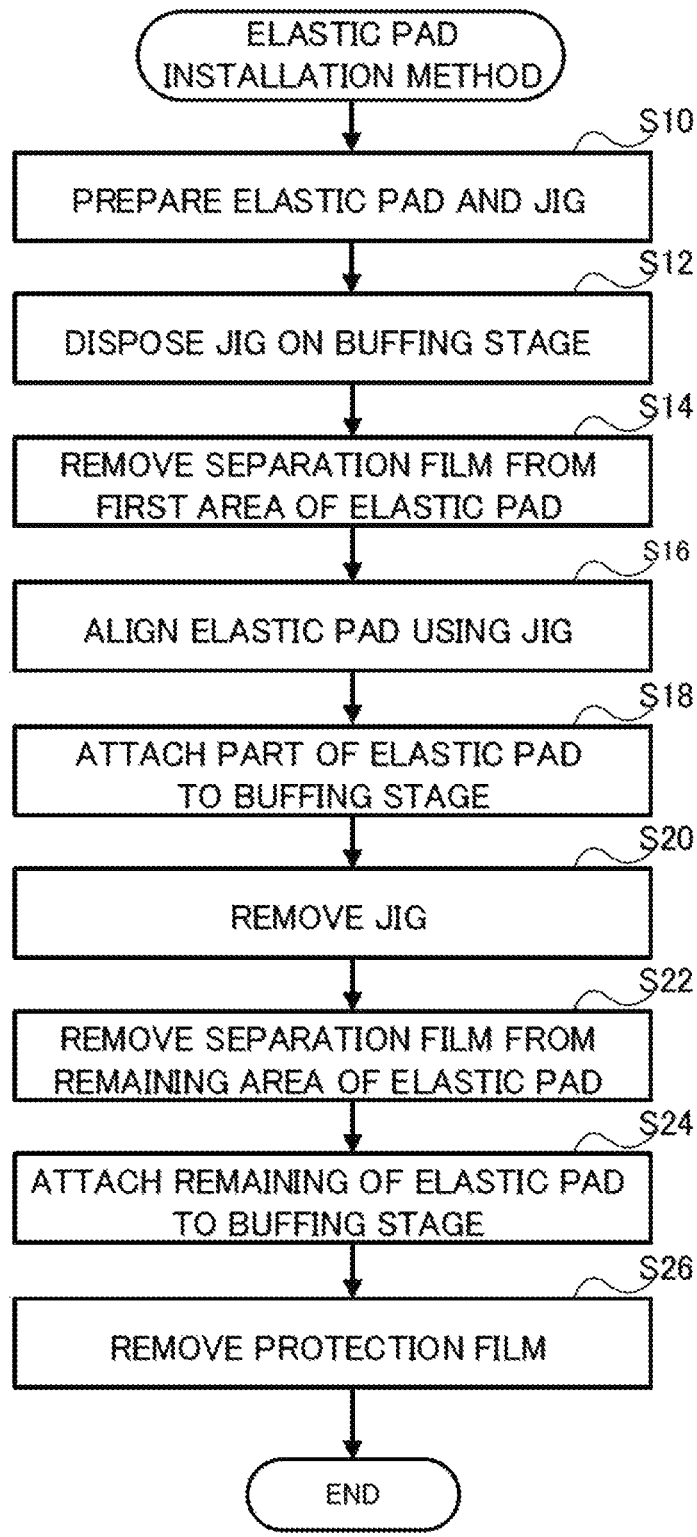
FIG. 9 is a flowchart illustrating an example of an elastic pad installation method according to the embodiment.

Next, an installation method of the elastic pad 450 using the jig 40 described above will be described. FIG. 9 is a flowchart illustrating an example of an elastic pad installation method according to the embodiment. In installing the elastic pad 450 on the buffing stage 400, firstly, the elastic pad 450 is prepared, and the jig 40 is prepared (S10). It is assumed that as the elastic pad 450, an elastic pad like the elastic pad illustrated in FIG. 6 is prepared in which a separation film 460 is attached to a surface where an adhesive layer 458 is provided and a protection sheet 470 is attached to an opposite surface. It is also assumed that openings like the openings (the holes 454, the notches 476, and the grooves 474) on the elastic pad 450 are formed on the separation film 460 and the protection sheet 470. Further, it is assumed that as the jig 40, a jig 40 like the jig 40 illustrated in FIGS. 7 and 8 is prepared. In this embodiment, two jigs 40 are described as being used; however, the present invention is not limited to this example.

Figure 10:
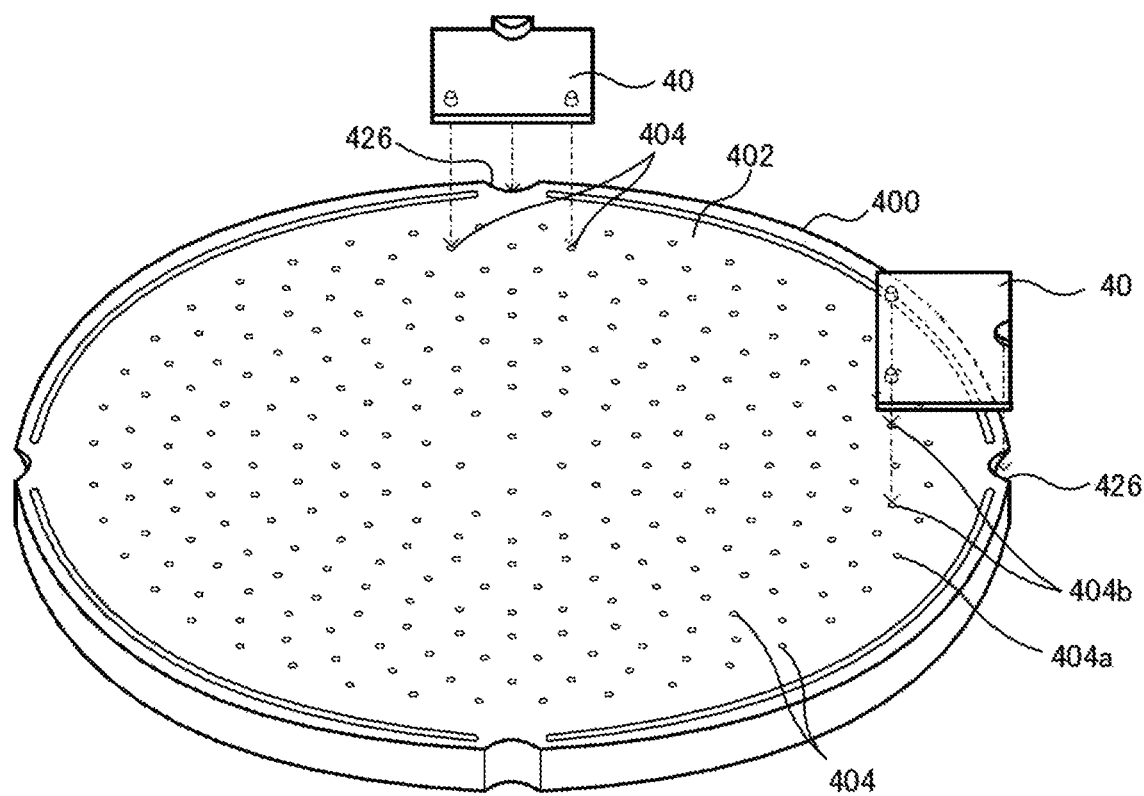
FIG. 10 is a drawing illustrating an example of a step of disposing the jig on to the buffing stage.

Following this, the jig 40 so prepared is disposed on the buffing stage 400 (S12). FIG. 10 is a drawing illustrating an example of a step of disposing the jig 40 on the buffing stage 400. As illustrated in FIG. 10, the first projecting portions 43 of each of the jigs 40 are inserted into the first openings 404 (the first openings 404b on the second radially outermost circumferential row from the outer circumferential side) of the buffing stage 400, so that the lower surface 42 (the support portion) of the jig 40 comes into contact with the stage surface 402, whereby the jig 40 can be installed on the stage surface 402. In this embodiment, the third projecting portion 44 is formed on the jig 40 in such a manner as to correspond to the recess portion 426 on the circumferential edge portion of the buffing stage 400. This enables a working person to dispose the jig 40 on the buffing stage 400 by aligning the third projecting portion 44 on the jig 40 with the recess portion 426 on the buffing stage 400, whereby the variation in installing methods among working persons can be suppressed. In the example illustrated in FIG. 10, two jigs 40 are disposed in such a manner as to be spaced 90° away from each other on the circumferential edge portion of the buffing stage 400; however, the present invention is not limited to this example, and hence, an arbitrary number of jigs 40 should be disposed in arbitrary locations on the buffing stage 400.

Figure 11:
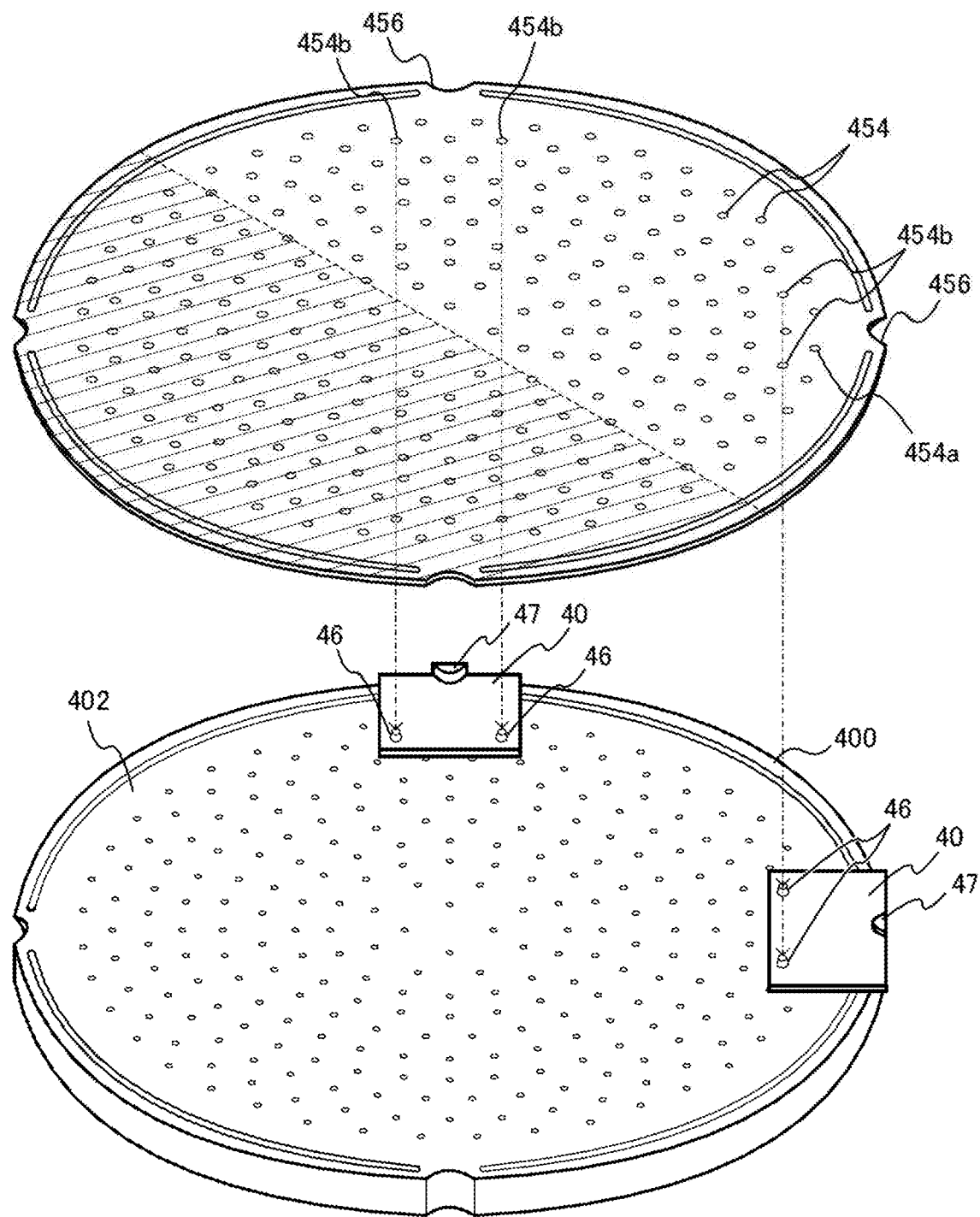
FIG. 11 is a drawing illustrating an example of a step of aligning the elastic pad using the jig.

Next, part of the separation film 460 is removed from the elastic pad 450 (S14), and the elastic pad 450 is aligned properly on the buffing stage 400 by use of the jigs 40 (S16). FIG. 11 is a drawing illustrating an example of a step of aligning the elastic pad 450 by use of the jigs 40. In FIG. 11, an area on the elastic pad 450 from which the separation film 460 is removed is hatched. In the example illustrated in FIG. 11, the separation film 460 is removed from a half of an overall area of the elastic pad 450 as one area (a first area) of the elastic pad 450. Then, the elastic pad 450 is aligned so that the second projecting portions 46 and the fourth projecting portion 47 of the jig 40 are inserted in the holes 454 (in this embodiment, the holes 454b on the second radially outermost circumferential row from the outer circumferential side) on the elastic pad 450 and the notch 476, respectively. In this embodiment, the openings like those formed on the elastic pad 450 are formed on the separation film 460 and the protection sheet 470 which are attached to the elastic pad 450. Due to this, the elastic pad 450 can be aligned properly on the buffing stage 400 by use of the jigs 40 with the separation film 460 and the protection sheet 470 left attached to the elastic pad 450.

Figure 12:
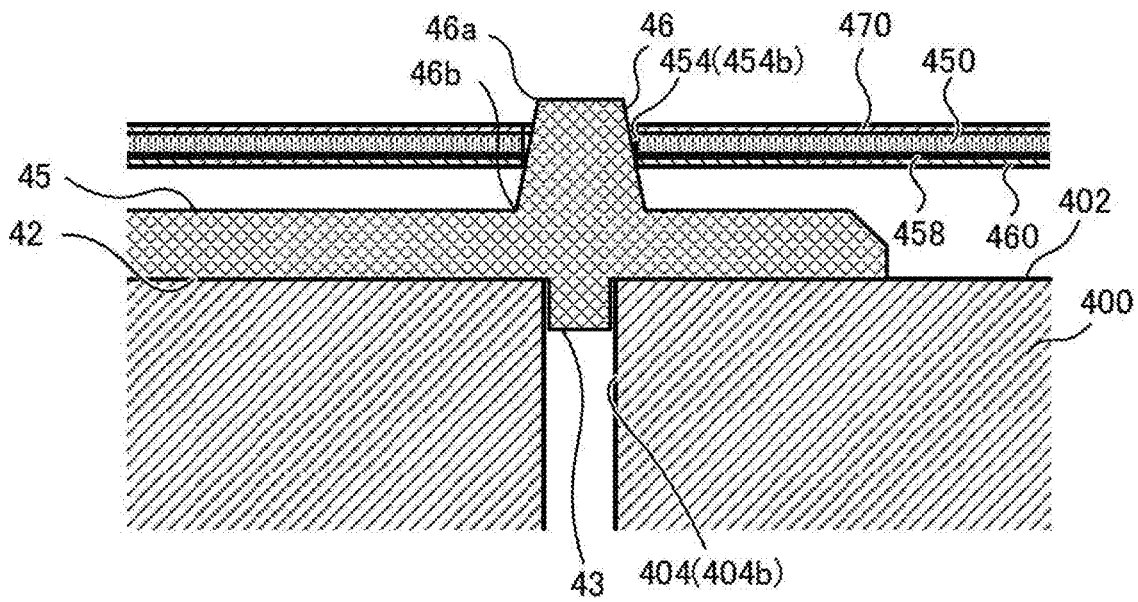
FIG. 12 is a cross-sectional view illustrating a state where the elastic pad is aligned properly on the buffing stage by the jig according to the embodiment.

FIG. 12 shows a cross-sectional view of the buffing stage 400 illustrating a state where the elastic pad 450 is aligned properly on the buffing stage 400 by the jigs 40 according to the embodiment. In the embodiment, the second projecting portion 46 of the jig 40 is tapered towards the distal end portion 46a, thereby facilitating inserting work of inserting the second projecting portion 46 into the hole 454 on the elastic pad 450. In this embodiment, the proximal portion 46b of the second projecting portion 46 is larger than the hole 454 on the elastic pad 450, thereby making it possible to support the elastic pad 450 without a contact of the upper surface 45 of the jig 40 with the elastic pad 450. This facilitates gripping work of gripping up the elastic pad 450 from the jigs 40 and the buffing stage 400. In this embodiment, the elastic pad 450 is described as being aligned with the separation film 460 left attached to the elastic pad 450; however, the elastic pad 450 may be aligned by use of the jigs 40 with the separation film 460 removed. In this case, too, according to the jig 40 of this embodiment, the elastic pad 450 can be aligned properly without a contact of the upper surface 45 of the jig 40 with the adhesive layer 458 of the elastic pad 450. In the flowchart illustrated in FIG. 9, the elastic pad 450 is described as being aligned by use of the jigs 40 after the separation film 460 is removed from the first area of the elastic pad 450; however, the present invention is not limited to this example, and hence, the separation film 460 may be removed from at least the one area of the elastic pad 450 after the elastic pad 450 is aligned by use of the jigs 40.

Figure 13:
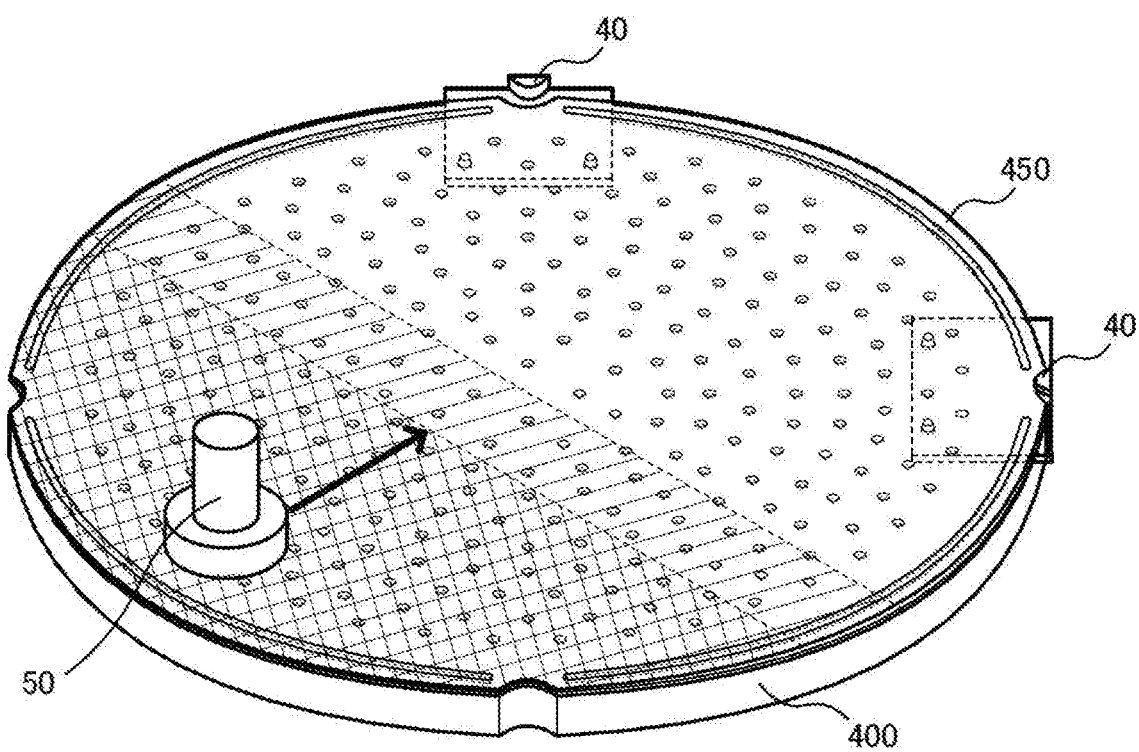
FIG. 13 is a drawing illustrating an example of a step of attaching the elastic pad.

Following this, the one area of the elastic pad 450 is attached to the buffing stage 400 (S18). FIG. 13 is a drawing illustrating an example of a step of attaching the elastic pad 450. Since the elastic pad 450 is aligned with the buffing stage 400 with the jigs 40 currently, the elastic pad 450 can be attached with the elastic pad 450 and the buffing stage 400 aligned with each other. In this embodiment, the elastic pad 450 is described as being attached to the buffing stage 400 in one area (a crosshatched area in the figure) of an area (a hatched area in the figure) where the separation film 460 is removed. As an example, the elastic pad 450 is preferably attached to the stage surface 402 over, for example, one third of an overall area of the stage surface 402 so that an area spaced less than a predetermine distance away from the area where the separation film 460 is left attached to the elastic pad 450 is not attached to the buffing stage 400. As a result, the separation film 460 left attached to the elastic pad 450 can easily be peeled off from the elastic pad 450. In addition, in the example illustrated in FIG. 13, air trapped between the elastic pad 450 and the stage surface 402 is released by pressing on the elastic pad 450 by use of a second jig 50 having a flat bottom surface. In releasing the trapped air using the jig 50, the elastic pad 450 is preferably pressed on by the jig 50 from an end portion of the elastic pad 450 towards a center thereof as illustrated by a bold arrow in FIG. 13. Here, in the elastic pad 450 of this embodiment, as described above, since the protection sheet 470 having a lower extensibility than that of the elastic pad 450 is attached to the elastic pad 450, in attaching the elastic pad 450 to the buffing stage 400, the protection sheet 470 can prevent the elastic pad 450 from stretching or contracting, whereby the holes 454 on the elastic pad 450 can be restrained from being offset from the positions where the first openings 404 are provided on the buffing stage 400.

Figure 14:
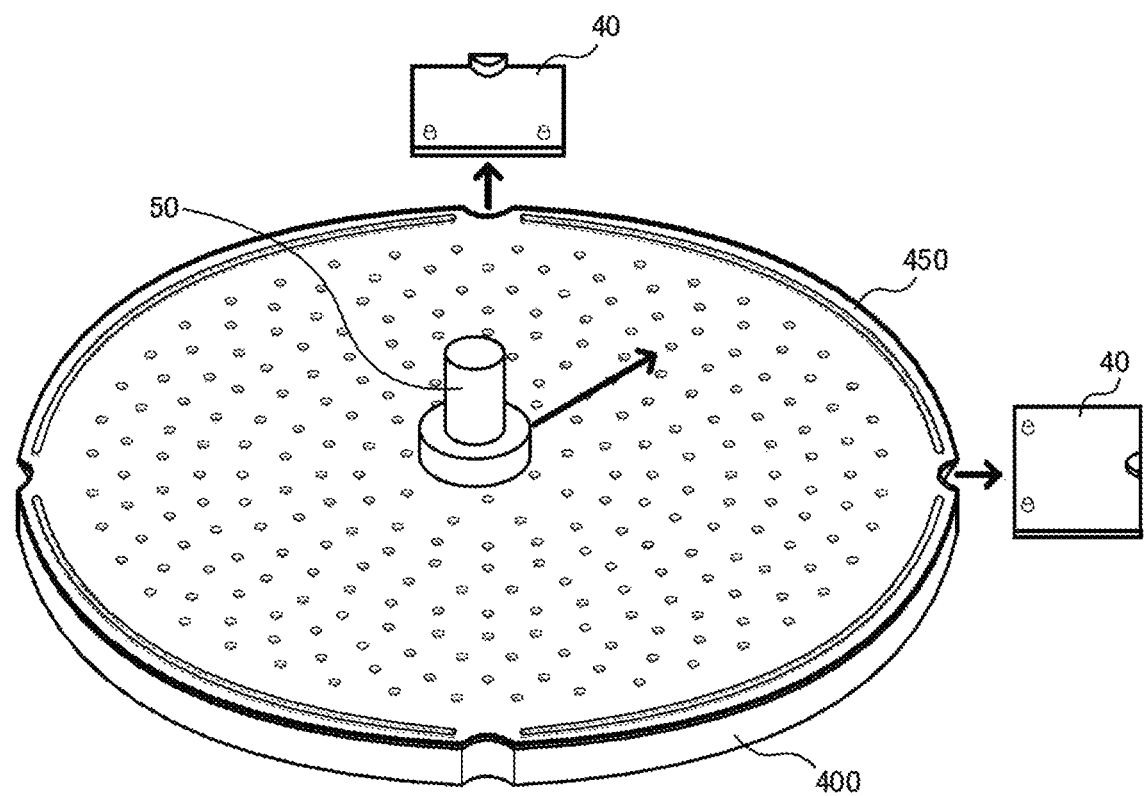
FIG. 14 is a drawing illustrating an example of a step of attaching the elastic pad by removing the jig.

The jigs 40 are removed from the buffing stage 400 and the elastic pad 450 after the one area of the elastic pad 450 is attached to the buffing stage 400 (S22), and then, the remaining portion of the elastic pad 450 is attached to the buffing stage 400 (S24). FIG. 14 is a drawing illustrating an example of a step of attaching the elastic pad by removing the jigs. The jigs 40 should be removed while flexing the elastic pad 450. Since the part of the elastic pad 450 is attached to the buffing stage 400 with the elastic pad 450 having been aligned with the buffing stage 400, even though the jigs 40 are removed, the elastic pad 450 and the buffing stage 400 are allowed to remain aligned with each other. Then, the elastic pad 450 can easily be attached to the buffing stage 400 by attaching the remaining area of the elastic pad 450 to the buffing stage 400. At this time, as illustrated in FIG. 14, air trapped between the elastic pad 450 and the stage surface 402 is preferably released by pressing on the elastic pad 450 by use of the second jig 50 having the flat bottom surface. Since the protection sheet 470 is attached to the elastic pad 450, as done in S18, the holes 454 on the elastic pad 450 can be restrained from being offset from the positions of the first openings 404 on the buffing stage 400 in the air releasing step. Then, removing the protection sheet 470 from the elastic pad 450 (S26) terminates the installation of the elastic pad 450 by use of the jigs 40.

The jig 40 of this embodiment that has been described heretofore includes the first projecting portions 43 that can be inserted into the first openings 404 on the buffing stage 400, the lower surface 42 that comes into contact with the stage surface 402 with the first projecting portions 43 inserted in the first openings 404, and the second projecting portion 46 that projects toward the opposite side to the side to which the first projecting portions 43 project and is configured to be insertable into the hole 454 on the elastic pad 450. According to the jig 40 described above, the first projecting portions 43 of the jig 40 are inserted into the first openings 404 on the buffing stage 400, and the second projecting portion 46 is inserted into the hole 454 on the elastic pad 450, whereby the buffing stage 400 can easily be aligned with the elastic pad 450.

In this embodiment, while the jig 40 is described as including the two first projecting portions 43, the present invention is not limited to this example, and hence, the jig 40 may include one or three or more first projecting portions 43. Additionally, while the jig 40 is described as including the third projecting portion 44 that corresponds to the recess portion 426 on the buffing stage 400, the present invention is not limited to this example, and hence, for example, the jig 40 may include no third projecting portion 44. While the jig 40 is described as including the two second projecting portions 46, the present invention is not limited to this example, and hence, the jig 40 may include one or three or more second projecting portions 46. While the second projecting portion 46 is described as being tapered in such a manner that the proximal portion 46*b* is larger than the hole 454 on the elastic pad 450, the present invention is not limited to this example, and hence, the second projecting portion 46 may be tapered in such a manner that the proximal portion 46*b* is sized to be equal to or smaller than the hole on the elastic pad 450. Alternatively, the second projecting portion 46 may not be tapered. While the jig 40 is described as including the fourth projecting portion 47 that corresponds to the notch 476 on the elastic pad 450, the present invention is not limited to this example, and hence, for example, the jig 40 may include no fourth projecting portion 47.

The present invention can also be described in the following modes.

[Mode 1] According to Mode 1, there is proposed a jig for use in installing an elastic pad on a stage surface of a vacuum suction holding stage, wherein a vacuum hole is formed on the stage surface, the vacuum hole being configured to be connectable to a vacuum source, wherein a hole is formed on the elastic pad, the hole corresponding to the vacuum hole, and wherein the jig comprises a first projecting portion configured to be insertable into the vacuum hole on the vacuum suction holding stage, a support portion configured to come into contact with the stage surface with the first projecting portion inserted in the vacuum hole, and a second projecting portion projecting toward an opposite side to the first projecting portion with respect to the support portion and configured to be insertable into the hole on the elastic pad. According to Mode 1, the first projecting portion can be inserted in the vacuum hole in the vacuum suction holding stage, while the second projecting portion can be inserted in the hole on the elastic pad, whereby the vacuum suction holding stage and the elastic pad can easily be aligned with each other.

[Mode 2] According to Mode 2, in the jig according to Mode 1, a recess portion is formed on a circumferential edge portion of the vacuum suction holding stage, and the jig further comprises a third projecting portion that corresponds to the recess portion. According to Mode 2, the third projecting portion of the jig can be fitted in the circumferential edge portion of the vacuum suction holding stage, thereby making it possible to suppress the variation in attachment of the elastic pad to the vacuum suction holding stage by the working person.

[Mode 3] According to Mode 3, in the jig according to Mode 1 or 2, the jig comprises two or more of the first projecting portions and the second projecting portions. According to Mode 3, the alignment of the vacuum suction holding stage with the elastic pad can be executed more accurately.

[Mode 4] According to Mode 4, in the jig according to any one of Modes 1 to 3, the second projecting portion has a tapered shape in which the second projecting portion becomes larger as the second projecting portion extends away from a distal end portion thereof. According to Mode 4, the second projecting portion of the jig can easily be inserted into the hole on the elastic pad.

[Mode 5] According to Mode 5, in the jig according to Mode 4, the second projecting portion has the tapered shape in which the second projecting portion is enlarged to a dimension larger than the hole on the elastic pad. According to Mode 4, a gap is produced between the elastic pad and the vacuum suction holding stage by the jig, and the elastic pad and the vacuum suction holding stage can be aligned with each other without a contact of an adhesive surface of the elastic pad with an adhesive surface of the vacuum suction holding stage.

[Mode 6] According to Mode 6, there is proposed an installation method for installing an elastic pad on a stage surface of a vacuum suction holding stage. This installation method comprises a preparation step of preparing the jig according to any one of Modes 1 to 5, an insertion step of inserting the first projecting portion of the jig into a vacuum hole formed on the stage surface of the vacuum suction holding stage, and an insertion step of inserting the second projecting portion of the jig into a hole on the elastic pad that corresponds to the vacuum hole. According to Mode 6, the vacuum suction holding stage can be aligned with the elastic pad, whereby the elastic pad can easily be installed on the stage surface of the vacuum suction holding stage.

[Mode 7] According to Mode 7, in the installation method according to Mode 6, one surface of the elastic pad constitutes an adhesive surface, and a separation film is attached to the adhesive surface, and the installation method further comprises a removal step of removing the separation film from a first area that constitutes one area on the adhesive surface, the one area excluding the hole in which the second projecting portion of the jig is inserted, and a attaching step of attaching at least part of the first area on the adhesive surface to the stage surface of the vacuum suction holding stage. According to Mode 7, the at least part of the first area of the elastic pad can be attached to the vacuum suction holding stage with the elastic pad kept aligned with the vacuum suction holding stage with the jig.

[Mode 8] According to Mode 8, in the installation method according to Mode 6 or 7, the installation method further comprises a release step of releasing air trapped between the elastic pad and the vacuum suction holding stage by pressing on the elastic pad. According to Mode 8, air can be restrained from remaining between the vacuum suction holding stage and the elastic pad.

[Mode 9] According to Mode 9, in the installation method according to any one of Modes 6 to 8, the installation method further comprises a preparation step of preparing the elastic pad in which a protection sheet having a lower extensibility than an extensibility of the elastic pad is attached to at least one surface of the elastic pad. According to Mode 9, the elastic pad can be restrained from extending or contracting when the elastic pad is installed.

Thus, while the embodiment of the present invention has been described heretofore, the embodiment of the present invention is intended to facilitate the understanding of the present invention and is not intended to limit the present invention. The present invention can be altered or modified without departing from the spirit and scope of the present invention, and the present invention, of course, includes equivalents thereof. Additionally, within the scope where at least part of the problem described above can be solved or at least part of the advantageous effect can be provided, the embodiment and its modified examples can be combined arbitrarily, and constituent elements that will be described in claims, which will be made hereunder, and the constituent elements described in the specifications can be combined arbitrarily or omitted.

REFERENCE SIGNS LIST 40 jig
41 plate-like portion
42 lower surface
43 first projecting portion
44 third projecting portion
45 upper surface
46 second projecting portion
46a distal end portion
46b proximal portion
47 fourth projecting portion
50 second jig
300 buffing device
400 buffing stage
402 stage surface
404 first opening
424 groove
426 recess portion
450 elastic pad
452 support surface
454 hole
458 adhesive layer
460 separation film
470 protection sheet
474 groove
476 notch
500 buff head
600 buff arm
700 liquid supply system
800 conditioning unit

What is claimed is:

1. An installation method for installing an elastic pad on a stage surface of a vacuum suction holding stage, comprising:
   a preparation step of preparing a jig, where the jig is for use in installing an elastic pad on a stage surface of a vacuum suction holding stage, wherein a vacuum hole is formed on the stage surface, the vacuum hole being configured to be connectable to a vacuum source, wherein a hole is formed on the elastic pad, the hole corresponding to the vacuum hole, and wherein the jig comprises: a first projecting portion configured to be insertable into the vacuum hole on the vacuum suction holding stage; a support portion configured to come into contact with the stage surface with the first projecting portion inserted in the vacuum hole; and a second projecting portion projecting toward an opposite side to the first projecting portion with respect to the support portion and configured to be insertable into the hole on the elastic pad;
   an insertion step of inserting the first projecting portion of the jig into a vacuum hole formed on the stage surface of the vacuum suction holding stage; and
   an insertion step of inserting the second projecting portion of the jig into a hole on the elastic pad that corresponds to aligns with the vacuum hole.

2. The installation method according to claim 1,
   wherein one surface of the elastic pad constitutes an adhesive surface, and a separation film is attached to the adhesive surface, and
   wherein the installation method further comprises:
   a removal step of removing the separation film from a first area that constitutes one area on the adhesive surface, the one area excluding the hole in which the second projecting portion of the jig is inserted; and
   an attaching step of attaching at least part of the first area on the adhesive surface to the stage surface of the vacuum suction holding stage.

3. The installation method according to claim 1, further comprising:
   a release step of releasing air trapped between the elastic pad and the vacuum suction holding stage by pressing on the elastic pad.

4. The installation method according to claim 1, further comprising:
   a preparation step of preparing the elastic pad in which a protection sheet having a lower extensibility than an extensibility of the elastic pad is attached to at least one surface of the elastic pad.

* * * * *